(12) United States Patent
Blanchard et al.

(10) Patent No.: US 7,397,097 B2
(45) Date of Patent: Jul. 8, 2008

(54) INTEGRATED RELEASED BEAM LAYER STRUCTURE FABRICATED IN TRENCHES AND MANUFACTURING METHOD THEREOF

(75) Inventors: Richard A. Blanchard, Los Altos, CA (US); Joseph C. McAlexander, Murphy, TX (US)

(73) Assignee: STMicroelectronics, Inc., Carrollton, TX (US)

( * ) Notice: Subject to any disclaimer, the term of this patent is extended or adjusted under 35 U.S.C. 154(b) by 506 days.

(21) Appl. No.: 10/721,524

(22) Filed: Nov. 25, 2003

(65) Prior Publication Data

US 2005/0110110 A1 May 26, 2005

(51) Int. Cl.
*H01L 23/48* (2006.01)
(52) U.S. Cl. ...................... 257/415; 257/734
(58) Field of Classification Search ................. 257/416, 257/412, 418, 419, 415, 734
See application file for complete search history.

(56) References Cited

U.S. PATENT DOCUMENTS

| | | | |
|---|---|---|---|
| 4,653,326 A | 3/1987 | Danel et al. ............... 73/517 R |
| 4,855,544 A | 8/1989 | Glenn ................. 200/61.45 R |
| 5,016,072 A | 5/1991 | Greiff ........................ 357/26 |
| 5,129,983 A | 7/1992 | Freiff ........................ 156/628 |
| 5,316,979 A | 5/1994 | MacDonald et al. ........ 437/203 |
| 5,465,604 A | 11/1995 | Sherman ................... 731/1 DV |
| 5,496,436 A | 3/1996 | Bernstein et al. ......... 156/628.1 |
| 5,503,017 A * | 4/1996 | Mizukoshi ............... 73/514.36 |
| 5,610,335 A * | 3/1997 | Shaw et al. .............. 73/514.36 |
| 5,610,337 A | 3/1997 | Nelson ........................ 73/651 |
| 5,707,077 A | 1/1998 | Yokota et al. ............... 280/735 |
| 5,846,849 A | 12/1998 | Shaw et al. .................. 438/52 |
| 5,847,454 A * | 12/1998 | Shaw et al. .................. 257/734 |
| 5,917,226 A * | 6/1999 | Chan et al. .................. 257/415 |

(Continued)

FOREIGN PATENT DOCUMENTS

EP  0 937 985 A1  8/1999

(Continued)

*Primary Examiner*—Thomas L Dickey
(74) *Attorney, Agent, or Firm*—David V. Carlson; Lisa K. Jorgenson

(57) ABSTRACT

A released beam structure fabricated in trench and manufacturing method thereof are provided herein. One embodiment of a released beam structure according to the present invention comprises a semiconductor substrate, a trench, a first conducting layer, and a beam. The trench extends into the semiconductor substrate and has walls. The first conducting layer is positioned over the walls of the trench at selected locations. The beam is positioned with the trench and is connected at a first portion thereof to the semiconductor substrate and movable at a second portion thereof. The second portion of the beam is spaced from the walls of the trench by a selected distance. Therefore, the second portion of the beam is free to move in a plane that is perpendicular or parallel to the surface of the substrate, and could be deflected to electrically contact with the walls of the trench in response to a predetermined acceleration force or a predetermined temperature variation applied on the beam structure. Other beam structures such as a beam held at both ends, or a beam held in the middle are also possible. Several beam structures at different angles can be fabricated simultaneously and mechanical etching stops are automatically formed to prevent unwanted overstress conditions when manufacturing several beam structures at the same time. Beam structures can also be manufactured in three orthogonal directions, providing information on acceleration in any direction.

28 Claims, 12 Drawing Sheets

U.S. PATENT DOCUMENTS

| | | | |
|---|---|---|---|
| 6,008,138 A * | 12/1999 | Laermer et al. | 438/725 |
| 6,028,343 A | 2/2000 | Chan et al. | 257/417 |
| 6,058,778 A | 5/2000 | Chan et al. | 73/514.16 |
| 6,124,765 A | 9/2000 | Chan et al. | 331/116 |
| 6,171,879 B1 | 1/2001 | Chan et al. | 438/52 |
| 6,180,536 B1 * | 1/2001 | Chong et al. | 438/745 |
| 6,218,209 B1 | 4/2001 | Chan et al. | 438/52 |
| 6,235,550 B1 | 5/2001 | Chan et al. | 438/52 |
| 6,278,337 B1 | 8/2001 | Chan et al. | 331/116 M |
| 6,316,796 B1 | 11/2001 | Petersen et al. | 257/254 |
| 6,389,899 B1 | 5/2002 | Partridge et al. | |
| 6,410,361 B2 * | 6/2002 | Dhuler et al. | 438/54 |
| 2003/0209075 A1 | 11/2003 | Okada | 73/514.16 |

FOREIGN PATENT DOCUMENTS

| | | |
|---|---|---|
| WO | WO 02/41006 A2 | 5/2002 |

* cited by examiner

INTEGRATED RELEASED BEAM LAYER STRUCTURE FABRICATED IN TRENCHES AND MANUFACTURING METHOD THEREOF

BACKGROUND OF THE INVENTION

1. Field of the Invention

The present disclosure relates generally to a semiconductor released beam device, and in particular but not exclusively, relates to a semiconductor released beam device fabricated in trenches.

2. Description of the Related Art

Micro-electromechanical systems (MEMS) in semiconductors have arisen for various applications to sense temperature, pressure, strain, acceleration, rotation, chemical properties of liquids and gases, etc. Those MEMS structures are usually combined with other integrated circuits, such as metal oxide semiconductor (MOS) circuits or complimentary metal oxide semiconductor (CMOS) circuits, for analyzing and calculating the parameters sensed by MEMS. Therefore, the MEMS manufacturing processes are required to be compatible with the existing MOS or CMOS manufacturing processes such that the whole system is inexpensive, reliable, and compact.

Different MEMS structures in semiconductors have been proposed and developed for such various sensing purposes. For example, a released beam sensor was proposed in U.S. Pat. No. 5,917,226 for detecting temperature variation and an integrated released beam oscillator was proposed in U.S. Pat. No. 6,278,337. A similar released beam sensor was also proposed in U.S. Pat. No. 6,218,209 ('209 patent) for detecting acceleration and could be applied in airbag, anti-lock braking, or ride suspension systems for automobiles or in-flight aircraft monitoring systems.

The process sequence shown in the '209 patent includes the step of forming a sacrificial layer of material such as silicon dioxide above and in contact with a layer of material that serves as both an etch stop layer and a fixed contact layer, as shown in FIG. 1 of '209 patent. The layer of material that the released beam in formed from is located above and in contact with the sacrificial layer. The removal of the sacrificial layer in selected regions after the released beam material is patterned produced the structures that are used in sensor applications.

However, the released beam structure proposed in '209 patent could only detect the acceleration force in only one direction which is perpendicular to the surface of the substrate. Furthermore, even there is an etch stop layer under the sacrificial layer, there is no etch stop layer around the sides of the sacrificial layer and therefore it is difficult to control the etch process in the lateral direction when there are several released beam structures manufactured at the same time.

BRIEF SUMMARY OF THE INVENTION

According to principles of the present invention, an alternate released beam structure and an associated process sequence are proposed. One embodiment of a released beam structure according to the present invention comprises a semiconductor substrate, a trench, a first conducting layer, and a beam. The trench extends into the semiconductor substrate and has walls. The first conducting layer is positioned over the walls of the trench at selected locations. The beam is positioned within the trench and is connected at a first portion thereof to the semiconductor substrate and movable at a second portion thereof. The second portion of the beam is spaced from the walls of the trench by a selected distance. Therefore, the beam is free to move about any plane perpendicular to the surface in a plane that is parallel to the surface of the substrate. Other beam structures such as a beam held at both ends, or a beam held in the middle are also possible.

According to one embodiment of the present invention, the direction of the beam can be at any selected orientation, and several beams at different angles can be fabricated simultaneously. Moreover, according to the present invention, mechanical etching stops are automatically formed around the beam, preventing unwanted overstress conditions.

Also, according to one embodiment of the present invention, the width of the beam can be varied along its length from a set maximum value, since the width of the beam is controlled by the trench width, which is a variable with a value that can be chosen. Furthermore, different beams having different width, different length or different thickness can be fabricated simultaneously to allow different sensing purposes.

According to one embodiment of the present invention, the manufacturing process of the beam structure is compatible with the existing MOS or CMOS manufacturing processes, and the manufacturing process shown in '209 patent. Therefore, the beam structures of the present invention can be simultaneously fabricated with the beam structures mentioned in the '209 patent, allowing the fabrication of sensors having three sensing orthogonal axes.

BRIEF DESCRIPTION OF THE SEVERAL VIEWS OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION

The present invention will now be described more fully hereinafter with reference to the accompanying drawings, which illustrate preferred embodiments of the invention. This invention, however, may be embodied in many different forms and should not be construed as limited to the illustrated embodiments set forth herein. Rather, these illustrated embodiments are provided so that this disclosure will be thorough and complete, and will fully convey the scope of the invention to those skilled in the art.

Figure 1:
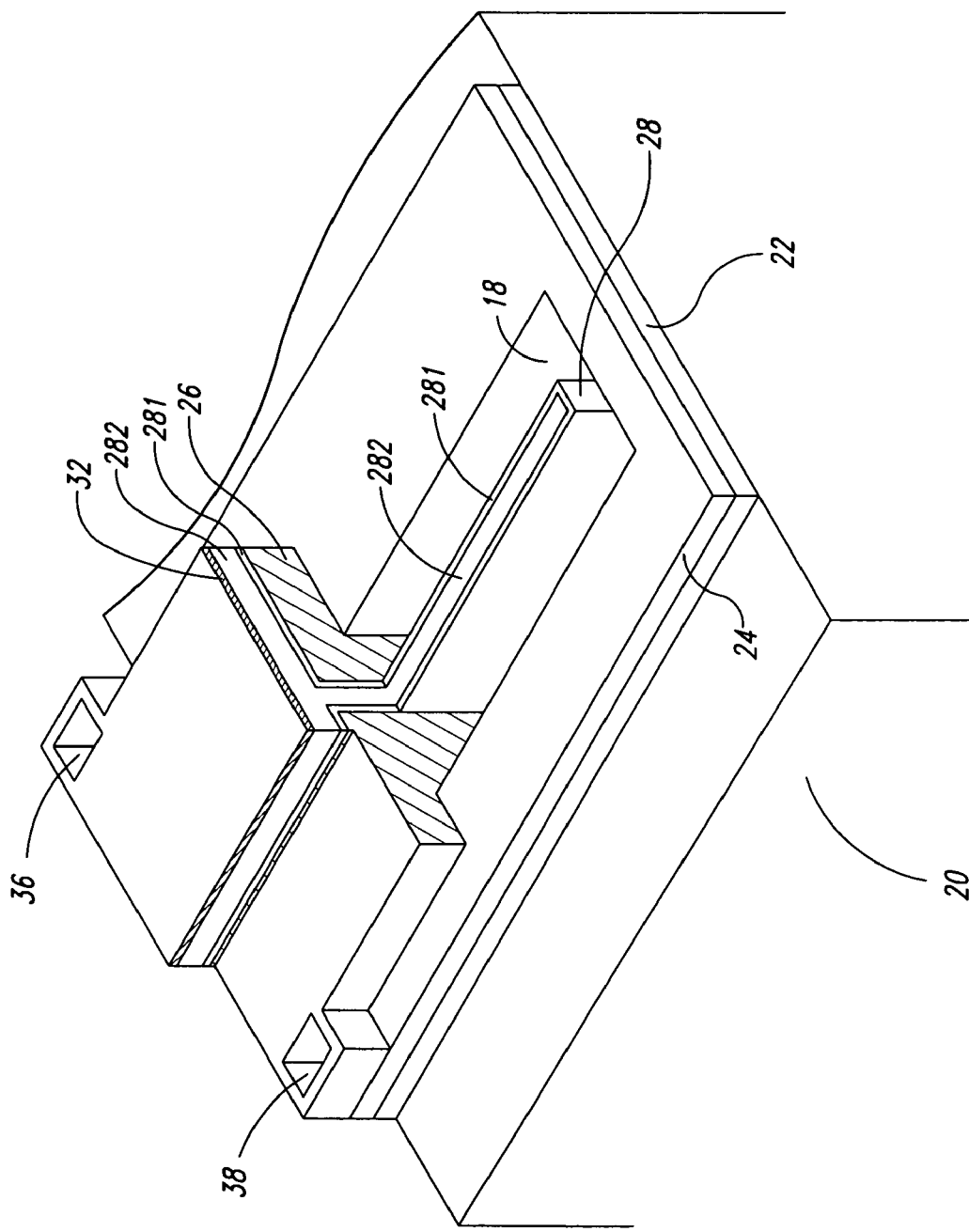
FIG. 1 is an isometric view of one embodiment of beam structure according to the present invention, wherein the beam structure is a cantilever beam in this embodiment.
Figure 2A:
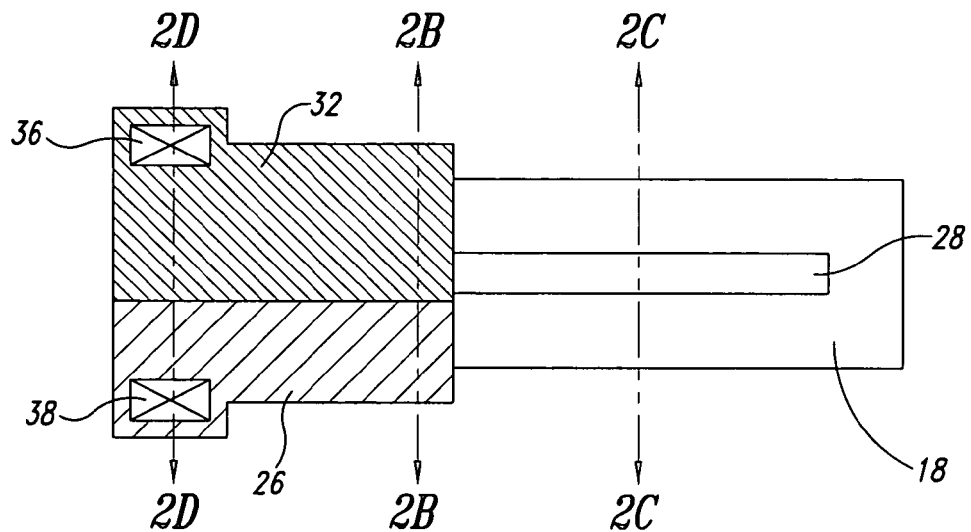
FIG. 2A is the top view of the embodiment of beam structure shown in FIG. 1.
Figure 2B:
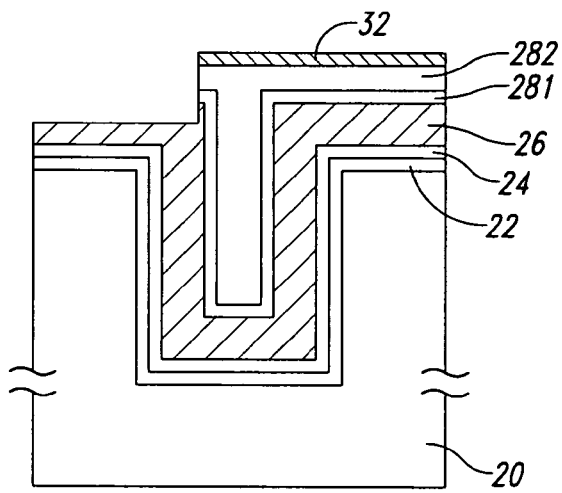
FIG. 2B is the cross-section view of the beam structure from line 2B-2B shown in FIG. 2A.
Figure 2C:
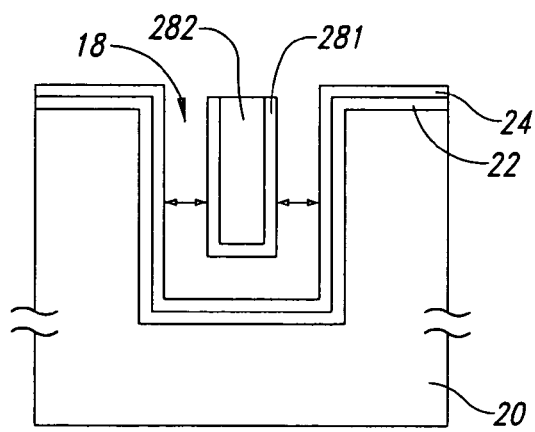
FIG. 2C is the cross-section view of the beam structure from line 2C-2C shown in FIG. 2A.
Figure 2D:
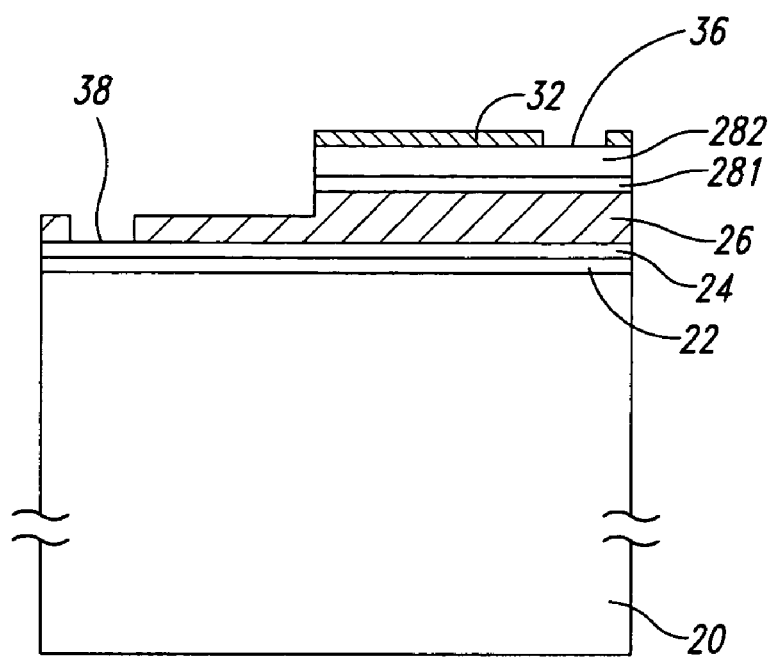
FIG. 2D is the cross-section view of the beam structure from line 2D-2D shown in FIG. 2A.

FIGS. 1-2D show one embodiment of released beam structure according to the present invention. FIG. 1 is an isometric view of an embodiment of beam structure of the present invention, wherein the released beam structure is a cantilever beam in this embodiment. As shown in FIG. 1, a trench 18 extends into a semiconductor substrate 20 and has a first conducting layer 24 positioned over the walls of the trench at selected locations. A beam 28 is positioned with the trench, and the beam 28 is connected at one end thereof to the substrate and is movable at the other end thereof. The movable end of the beam 28 is spaced from the walls of the trench 18 by a selected distance. The beam 28 comprises a second conducting layer 281 and a beam material layer 282. A second dielectric layer 32 is positioned on portion of the beam material layer 282. A remaining sacrificial layer 26 is between the connected end of the beam 28 and the first conducting layer 24.

FIG. 2A is the top view of the embodiment of beam structure shown in FIG. 1, and FIG. 2B is the cross-section view of the beam structure from line 2B-2B shown in FIG. 2A. As shown in FIG. 2B, the remaining sacrificial layer 26 is between the connected end of the beam 28 and the first conducting layer 24. In one embodiment, a first dielectric layer 22 is positioned between the semiconductor substrate 20 and the first conducting layer 24. The second dielectric layer 32 is positioned on the top of the beam material layer 282.

Referring to FIG. 2C, which is the cross-section view of the beam structure from line 2C-2C shown in FIG. 2A, the beam 28 is positioned with the trench 18 and the movable end of the beam 28 is spaced from the walls of trench 18 by a selected distance. When there is a predetermined acceleration force applied to the released beam structure of the present invention in the lateral direction shown by the arrows in FIG. 2C, the beam 28 will be deflected to electrically contact with the first conducting layer 24 on the sidewalls of the trench 18. Therefore, the predetermined acceleration force could be detected by sensing the electrical contact between the beam 28 and the first conducting layer 24. To detect such electrical contact signal, the appropriate sensing circuit is connected to the beam structure. A first window 36 in the second dielectric layer 32 permits contact to the beam material layer 282 and a second window 38 in the remaining sacrificial layer permits contact to the first conducting layer 24. In FIG. 2D, the first conducting layer 24 and the second conducting layer 281 are separate by the remaining sacrificial layer 26. However, when the beam 28 is deflected to electrically contact with the walls of the trench, such contact could be detected by a sensing circuit through the first window 36 and the second window 38.

Figure 3A:
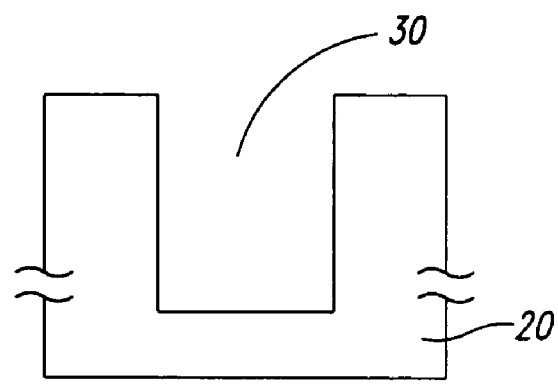
FIG. 3A is a schematic cross-sectional view of an initial trench formed in a semiconductor substrate.
Figure 3B:
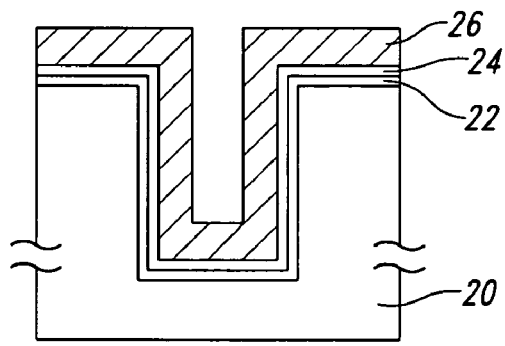
FIG. 3B is a schematic cross-sectional view of a first conducting layer and a sacrificial layer positioned on the initial trench.

FIGS. 3A-FIG. 3E show the manufacturing process for one embodiment of the released beam structure according to the present invention. First, an initial trench 30 is formed in the semiconductor substrate 20, as shown in FIG. 3A. Thereafter, the first conducting layer 24 and the sacrificial layer 26 are formed on the walls of the initial trench 30, as shown in FIG. 3B. The first conducting layer 24 comprises any acceptable conductor, such as a metal layer of tungsten, titanium, tantalum, aluminum, or an additional doped polysilicon layer. The sacrificial layer 26 comprises an oxide layer, such as a silicon dioxide, and the thickness of such sacrificial layer 26 is around 1000-10,000 Å. Furthermore, in order to prevent signal interference between different beam structures on the semiconductor substrate 20, the first dielectric layer 22 could be formed between the first conducting layer 24 and the semiconductor substrate 20. The first dielectric layer 22 could comprise an oxide layer, such as a silicon dioxide, or comprise an oxide layer and a silicon nitride layer. The thickness of the first dielectric layer 22 is in the range of 200-5000 Å.

Figure 3C:
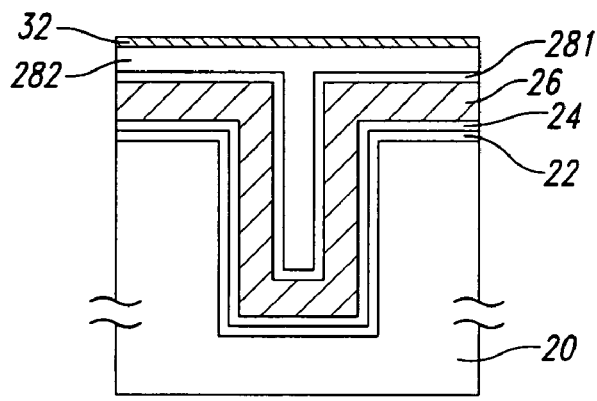
FIG. 3C is a schematic cross-sectional view showing a beam positioned on the sacrificial layer and a second dielectric layer positioned on the beam.

After forming the sacrificial layer 26, the beam 28 is deposited on the sacrificial layer 26. The beam 28 comprises the second conducting layer 281 and the beam material layer 282, as shown in FIG. 3C. The beam material layer 282 comprises a doped polysilicon layer, and the thickness thereof is around 1000-6000 Å. Of course, the beam layer 282 can be made of any acceptable material. If a heavy beam is desired, the entire beam can be made of metal or some other heavyweight material. The properties that can be controlled in the manufacturing of the beam, include the width of the beam, the distance from the side of the trench to the beam, the length of the beam, and the weight of the beam. While in most embodiments, the beam layer 282 is a conductor, this is not required. The layer 281 can be contacted instead to provide the desired signal.

Depending on the desired features to emphasize, in some instances the weight of the beam may be carefully controlled to be able to measure certain features. For example, the beam may be made quite heavy by using pure metal or, on the other hand, it may be made lighter by using polysilicon. Of course, the deflection distance which can be reasonably predicted for the various materials will determine the beam length and the distances, for example, the distance between the beam and the sidewall of the trench may be different than for an all-metal beam than for a beam made fully of polysilicon or a silicon dioxide. The design of these factors can be selected based on the desired end properties of the structure.

Figure 3D:
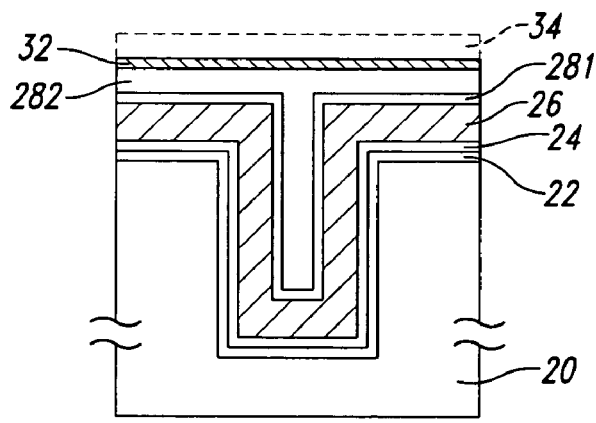
FIG. 3D is a schematic cross-sectional view showing a mask layer positioned on the second dielectric layer.

The second conducting layer 281 can be any acceptable conductor, such as tungsten, titanium, tantalum, aluminum, or polysilicon or a doped beam layer itself, such that the beam 28 could provide conductivity when the beam 28 contacts with the first conducting layer 24. Furthermore, the second dielectric layer 32 is formed on the beam material layer 282 to act as a protecting layer. The second dielectric layer 32 could comprise an oxide layer, such as a silicon dioxide, or comprise an oxide layer and a silicon nitride layer. Afterward, a portion of sacrificial layer is removed so that one end of the beam 28 remains coupled to the remaining sacrificial layer 26 and the other end of the beam 28 is movable and spaced from the walls by a selected distance. To remove the unwanted portion of the sacrificial layer and keep the desired portion, a mask layer 34, such as photo-resist, could be first positioned on part of the second dielectric layer 32 to be retained before etching the unwanted portion of the sacrificial layer, as shown in FIG. 3D. Then the unwanted portion of the beam material layer 282 and the second conducting layer 281 will be etched by any acceptable method, one of which is anisotropic etching to reveal the sacrificial layer. Thereafter, the unwanted portion of the sacrificial layer 26 will be removed through another etching process.

Figure 3E:
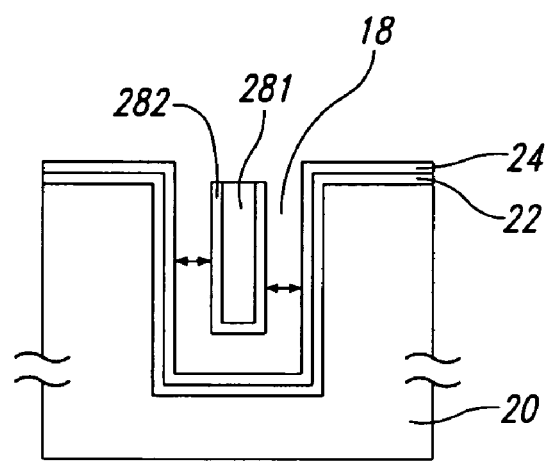
FIG. 3E is a schematic cross-sectional view showing the beam structure according to the present invention after etching portion of the sacrificial layer at the same location as FIG. 2C.

According to the present invention, because the first conducting layer 24 is formed on what will become the walls of the trench, and the conductive layer 281 is around the beam 282, etch stops are automatically formed around the beam 28, and in the trench preventing unwanted over-etch conditions when manufacturing several beam structures at the same time. The conductive layers 24 and 281 are not etched by the same etch chemistry that etches layer 26. A final trench 18 will be formed after the unwanted portion of the sacrificial layer is removed, as shown in FIG. 3E.

The process shown in FIG. 3A-FIG. 3E is compatible with the manufacturing process demonstrated in '209 patent, and therefore, the beam structures of the present invention can be simultaneously fabricated with the beam structures mentioned in the '209 patent, allowing the fabrication of sensors having three sensing orthogonal axes.

Figure 4:
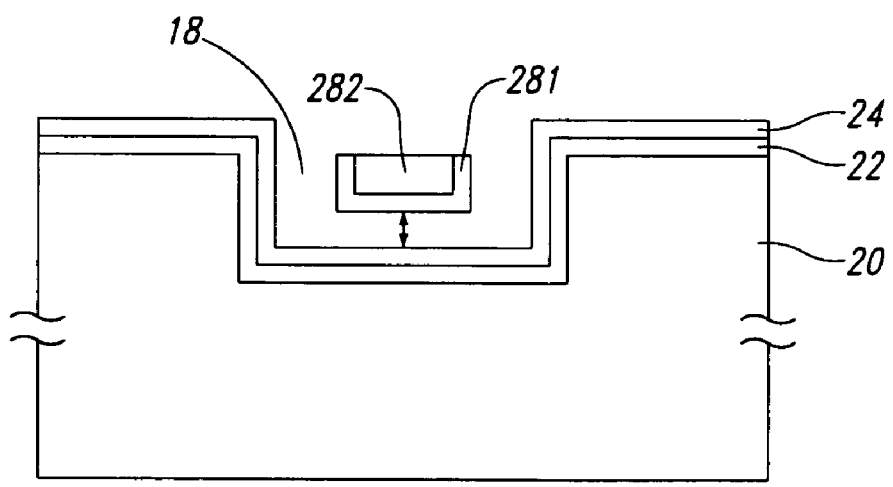
FIG. 4 is a schematic cross-sectional view of another embodiment of the present invention, wherein the beam could be deflected to electrically contact with the bottom wall of the trench.

FIG. 4 is a schematic diagram of another embodiment of the present invention. By modifying the width and thickness of the trench 18, the width and the thickness of the beam 28 could also be changed such that the beam 28 could be deflected to electrically contact with the bottom wall of the trench 18 when an acceleration force is applied in the vertical direction as shown by arrows in FIG. 4. Moreover, rather than to detect the acceleration, if the thermal expansion coefficient of the beam material layer 282 is different from that of the second conducting layer 281, in this embodiment of FIG. 4 the beam 28 could also be deflected to electrically contact with the bottom of the trench 18 in response to a predetermined temperature variation from a first temperature to a second temperature. Thus, the beam structure shown in FIG. 4 could be used to detect the temperature variation.

Figure 5A:
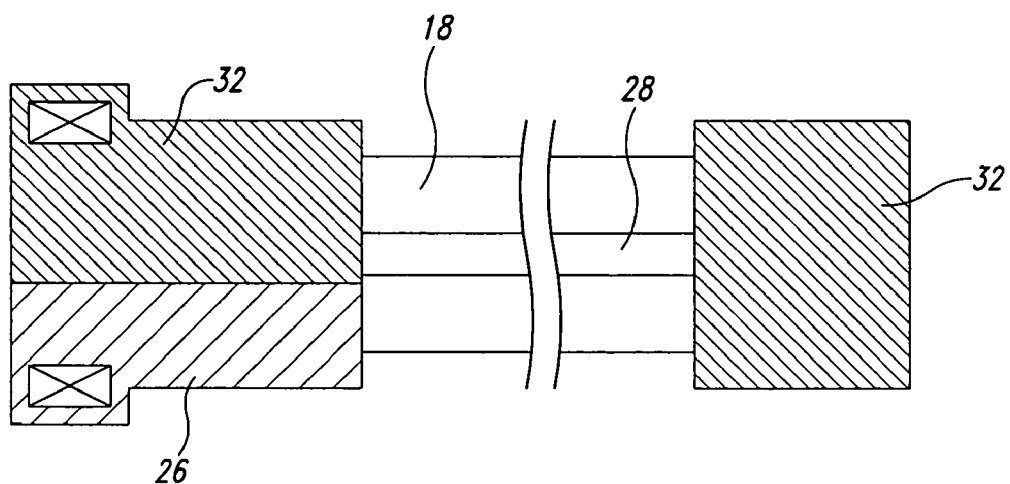
FIG. 5A is a top view of another embodiment of the present invention, wherein both ends of the beam are connected to the substrate and the center portion of the beam is movable.
Figure 5B:
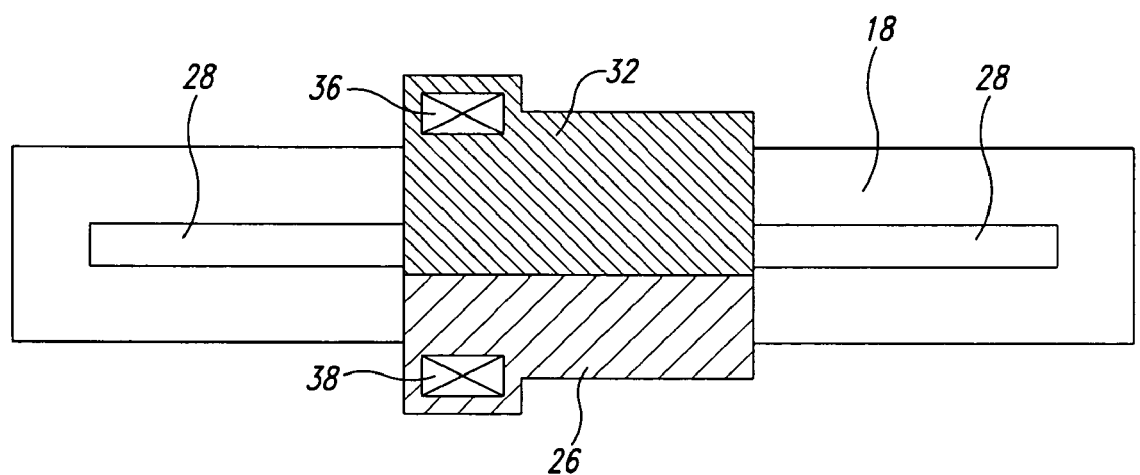
FIG. 5B is a schematic diagram of another embodiment of the present invention, wherein the center portion of the beam is connected to the substrate and both ends of the beam are movable.
Figure 5C:
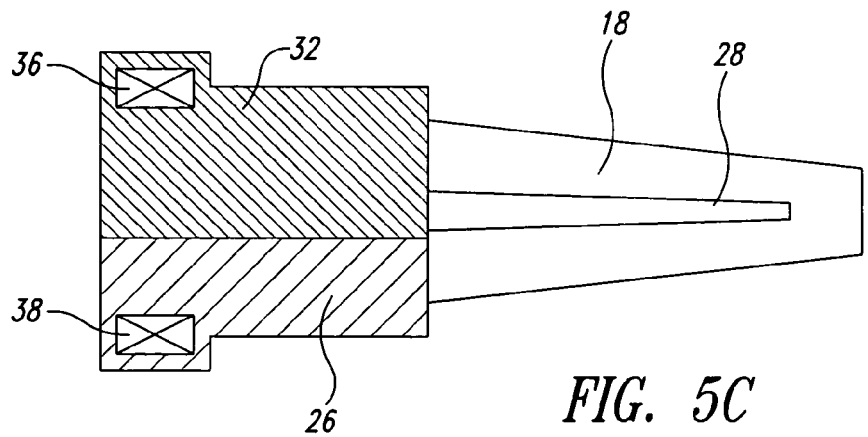
FIG. 5C is a schematic diagram of another embodiment of the present invention, wherein the width of the beam is gradually reduced along the length.

Furthermore, rather than to position the remaining sacrificial layer 26 at one end of the beam 28, the remaining sacrificial layer 26 could be positioned at both ends of the beam 28 as shown in FIG. 5A which is another embodiment of the present invention. In such situation, the middle part of the beam 28 could be deflected to electrically contact with the sidewalls or the bottom of the trench 18 when there is an acceleration force or temperature variation applied on such beam structure. Of course, another embodiment according to the present invention is also provided wherein the remaining sacrificial layer is positioned at the middle part of the beam 28, and both ends of the beam 28 are movable and could be deflected to electrically contact with the sidewalls or the bottom of the beam when an acceleration force or a temperature variation is applied to the beam structure, as shown in FIG. 5B. Moreover, according to the present invention, the thickness or width of the beam 28 can be varied along its length, from a set maximum value, since the thickness or the width of the released beam is related to thickness or the width of the trench, which is a variable with a value that can be chosen during the manufacturing process. For example, as another embodiment shown in FIG. 5C, the width of the beam 28 varies along its length, and the width of the beam is controlled by the width of the trench 18 which also varies along its length.

Figure 6:
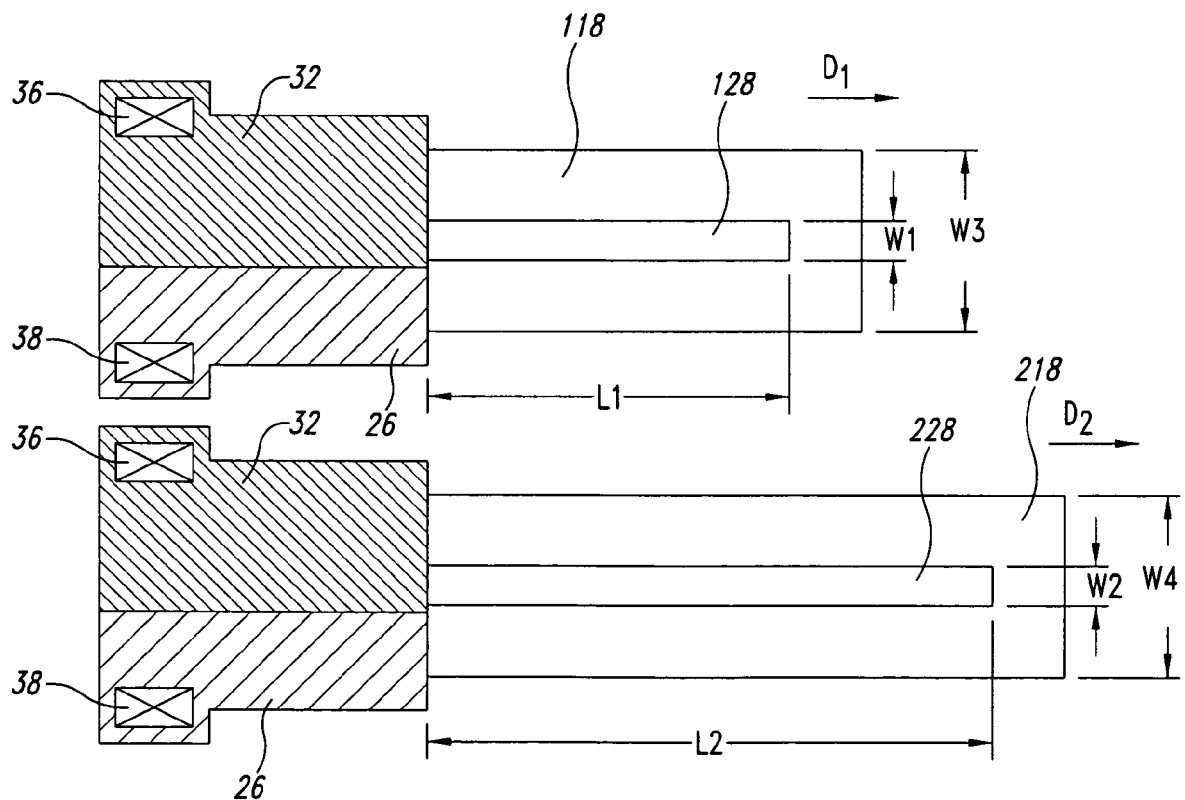
FIG. 6 is a schematic diagram of another embodiment of the present invention comprising two beam structures, wherein a first trench with a first beam extends in a first direction and a second trench with a second beam extends in a second direction, and the dimension of the first beam is different from that of the second beam.

The present invention also provides a semiconductor structure comprising a plurality of beam structures having a location or shape different from each other. For example, FIG. 6 is a schematic diagram of another embodiment of the present invention, wherein there are a first trench 118 with a first beam 128 extending in a first direction D1 and a second trench 218 with a second beam 228 extending in a second direction D2 in this embodiment. The first direction D1 could be different from, or parallel to the second direction D2. For example, when the first direction D1 is parallel to the second direction D2, the dimension of the first beam 128 could be different from that of the second beam 228 such that the semiconductor structure could be used to measure or detect different magnitude of the acceleration force at the direction perpendicular to the first or the second direction. As shown in FIG. 6, the length L1 of the first beam 128 is different from the length L2 of the second beam 228, and the width W1 of the first beam 128 could also be different from the width W2 of the second beam 228. The length and width of each beam could be controlled by the length and width of different trench. Therefore, this embodiment could detect at least two different magnitudes of the acceleration forces, because different dimension beam could be deflected to electrically contact with the walls of the trench in response to different magnitude acceleration force applied to this semiconductor structure. Also, the width W3 and W4 of the trench can be selected to control the sensitivity of the detection.

Figure 7:
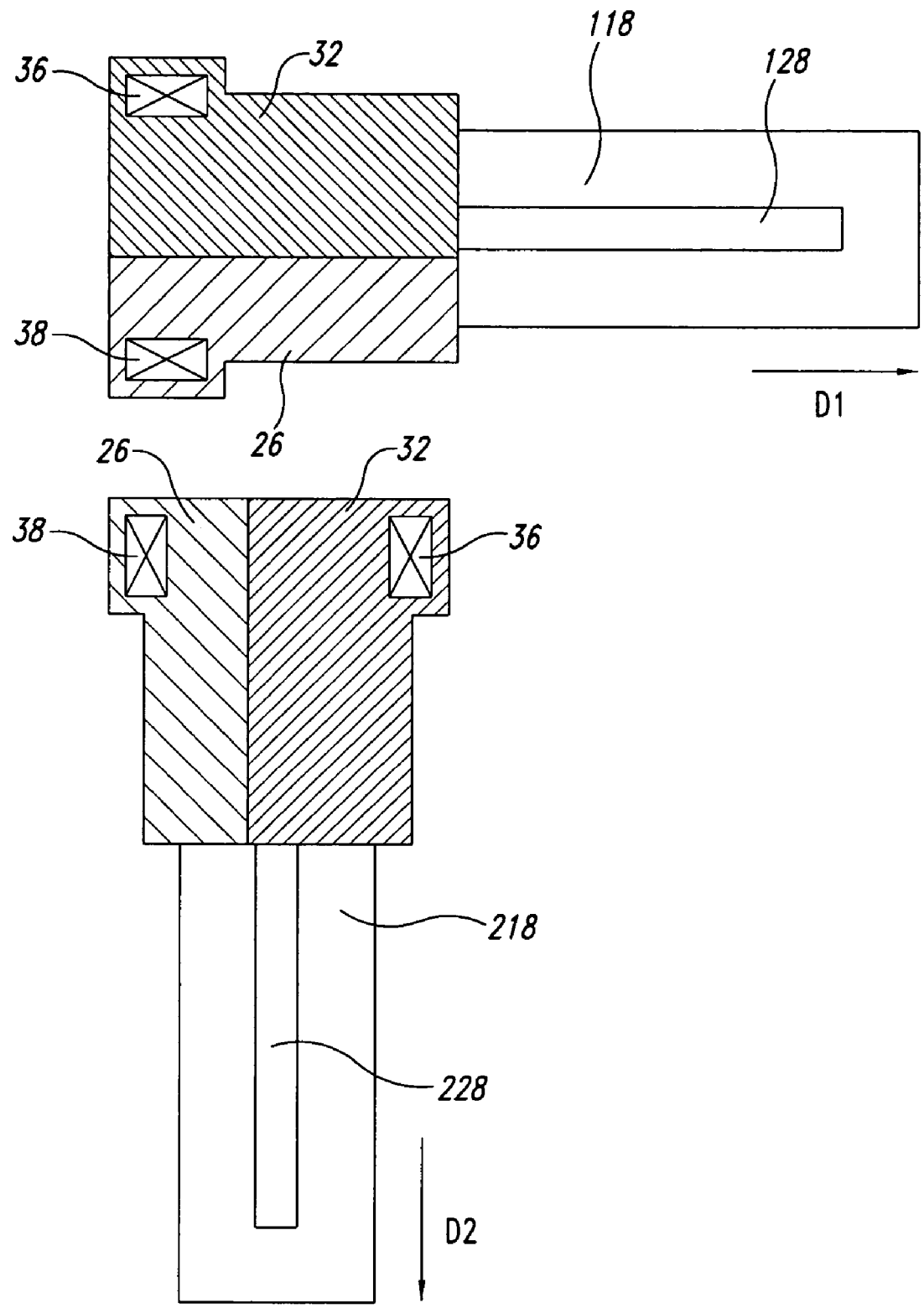
FIG. 7 is a schematic diagram of another embodiment of the present invention comprising two beam structures, wherein a first trench extends in a first direction and a second trench extends in a second direction, and the first direction is perpendicular to the second direction.

When the first direction D1 is different from the second direction D2, the semiconductor structure of the present invention could be used to measure or detect at least two different directions of acceleration forces each of which is individually perpendicular to the first direction D1 or to the second direction D2. For example, FIG. 7 is a schematic diagram of another embodiment of the present invention, wherein the first direction D1 is perpendicular to the second direction D2. Therefore the first beam 128 could be deflected to contact with the walls of the first trench 118 when a predetermined acceleration force is applied in the D2 direction, and the second beam 228 could be deflected to contact with the walls of the second trench 218 when another predetermined acceleration force is applied in the D1 direction. Of course, according to the present invention, it is also possible to combine different direction and different dimension of beam structures together.

Figure 8A:
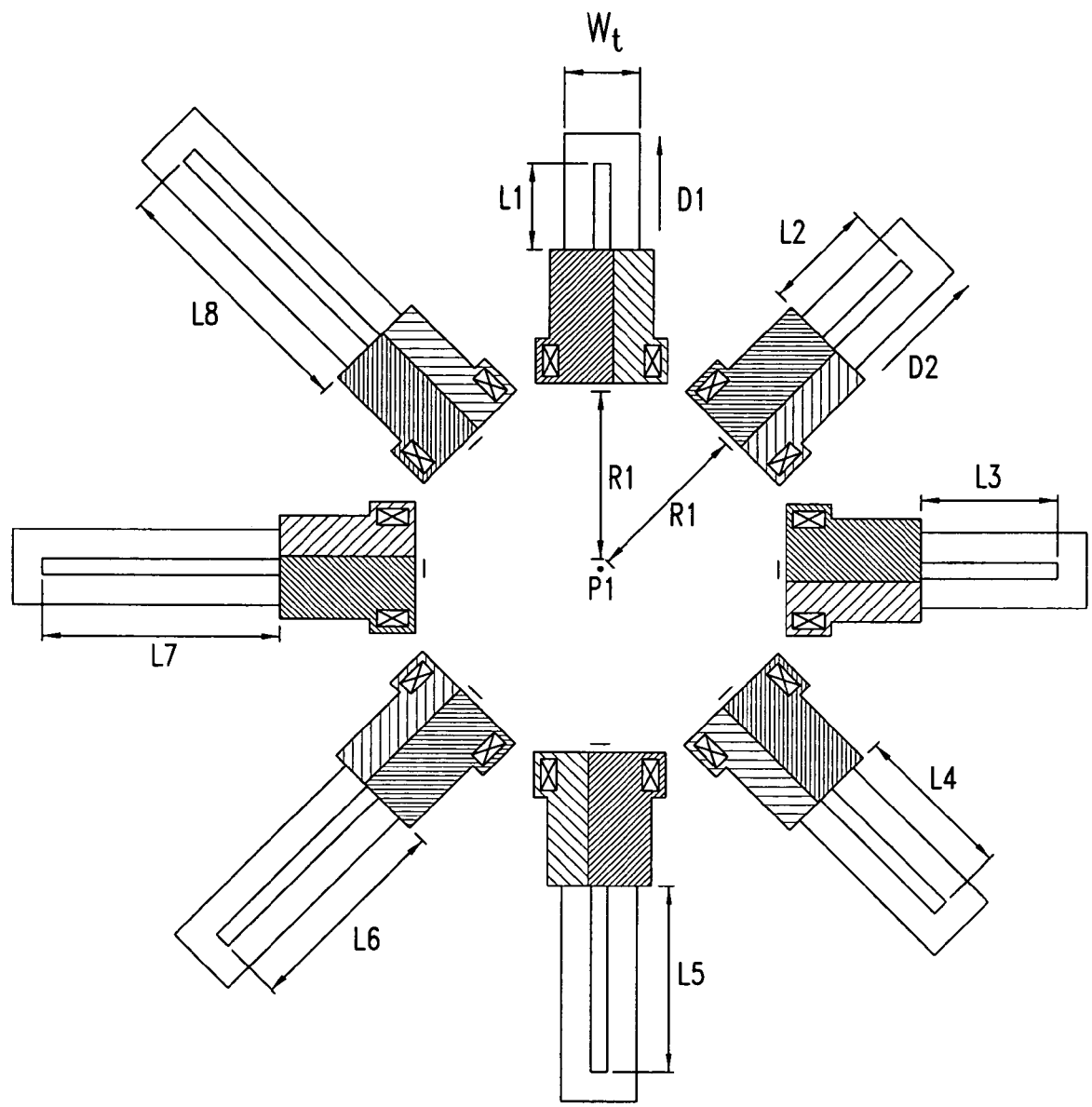
FIG. 8A is a schematic diagram of another embodiment of the present invention, wherein there are a plurality of beams positioned in radial arrangement having a common radius from a common point.
Figure 8B:
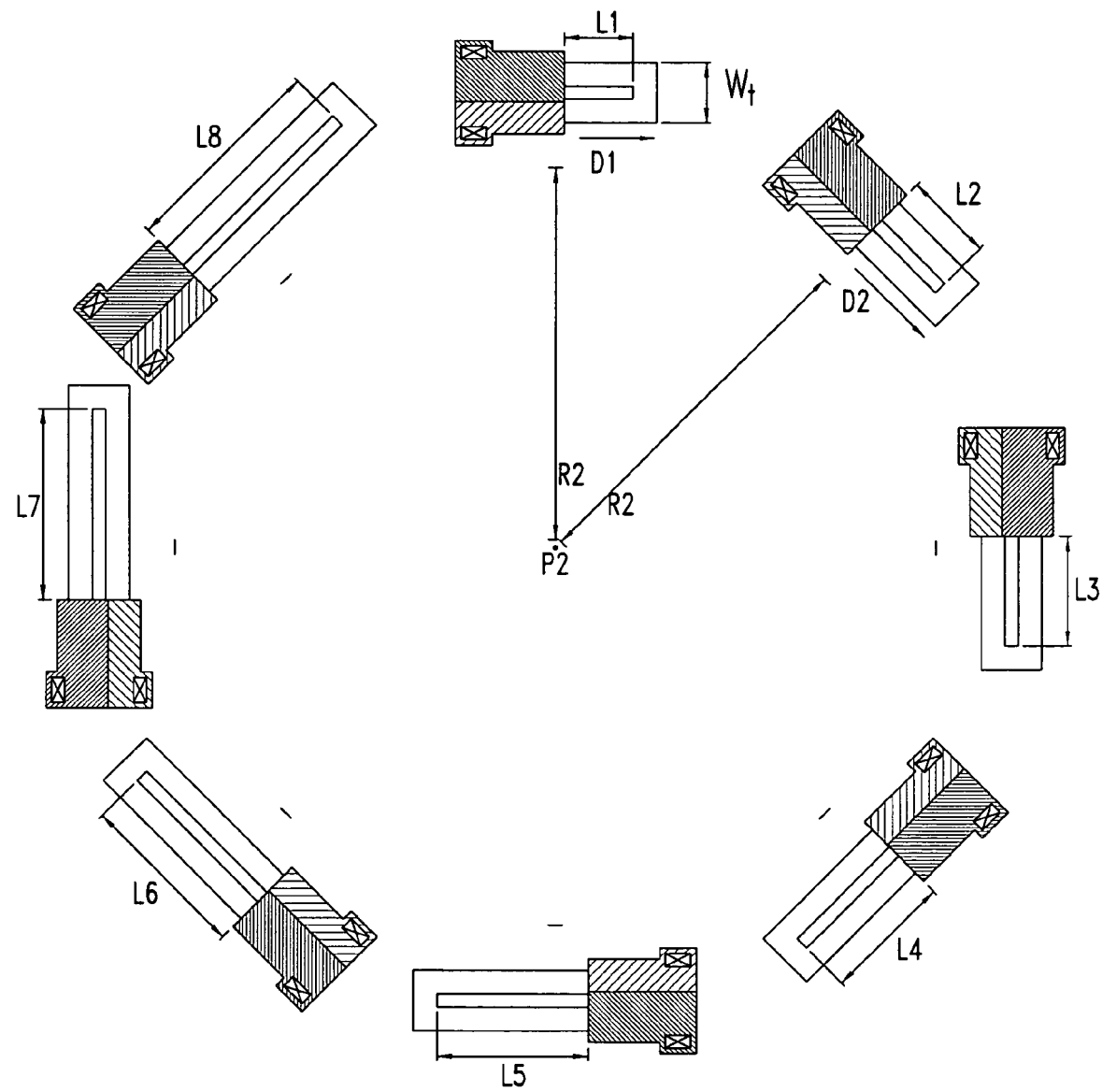
FIG. 8B is a schematic diagram of another embodiment of the present invention, wherein there are a plurality of beams positioned in circle arrangement having a common radius from a common point.

Besides detecting the linear acceleration force, the present invention could also be used to measure angular acceleration force and angular velocity. For example, FIG. 8A is a schematic diagram of another embodiment of the present invention, wherein there are a plurality of beam structures positioned in radial arrangement having a first common radius R1 from a first common point P1. Each beam structure has different length of beam varied from L1 to L8. Of course, each beam structure could have different width of beam by controlling the width Wt of different trench if necessary. When the embodiment of the present invention rotates around the first common point P1, each beam structure could detect different magnitude of angular acceleration because of the different dimension of each beam. Moreover, FIG. 8B is a schematic diagram of another embodiment of the present invention, wherein there are a plurality of beam structures positioned in circle arrangement having a second common radius R2 from a second common point P2. The length of each beam varies from L1 to L8, and of course each beam could have different width of beam by controlling the width Wt of different trench. Therefore, when the embodiment of the present invention rotates around the second common point P2, different beam structure could detect different angular velocity by measuring the acceleration force along the radial direction which is perpendicular to the direction the beam.

Figure 9A:
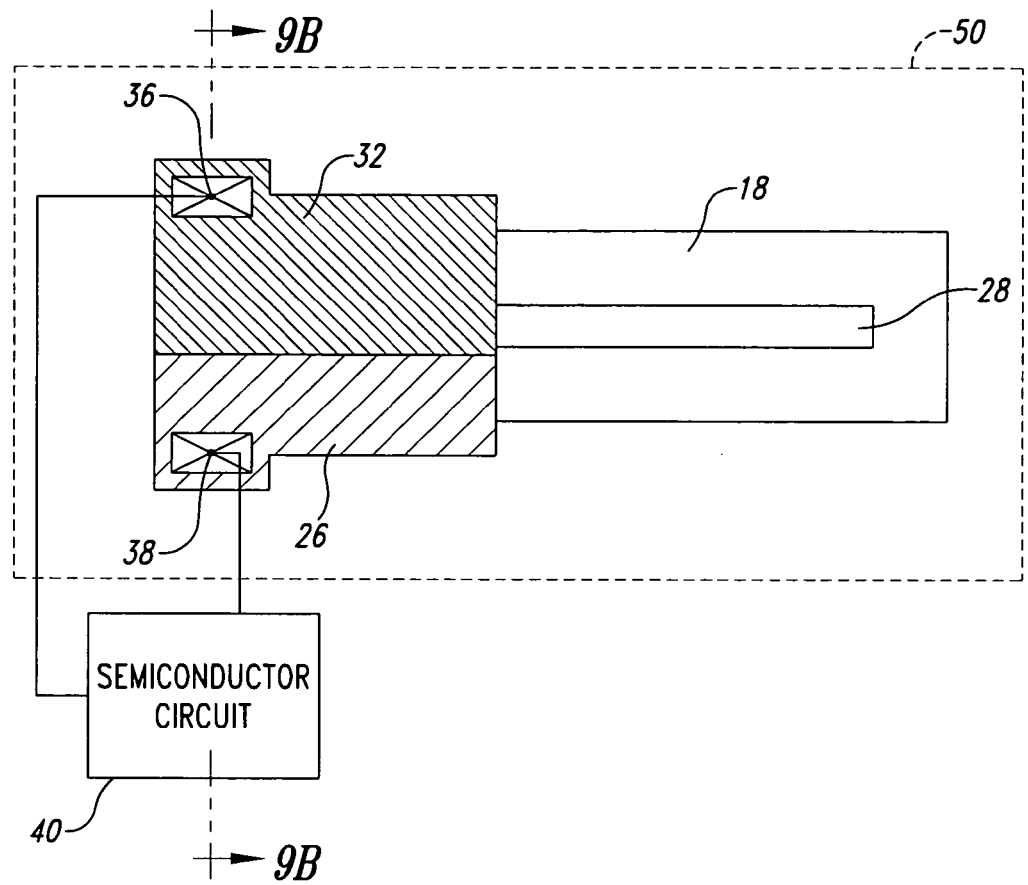
FIG. 9A is a schematic diagram of an integrated circuit according to an embodiment of the present invention.
Figure 9B:
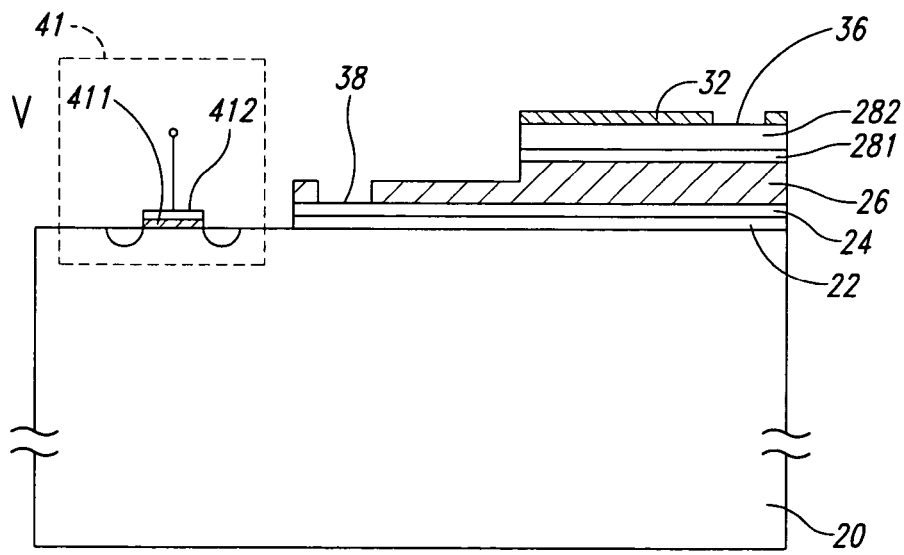
FIG. 9B is a schematic cross-section view of the integrated circuit from the line 9B-9B in FIG. 9A.

FIG. 9A is a schematic diagram of an integrated circuit on a semiconductor substrate according to an embodiment of the present invention. The integrated circuit comprises a sensor 50 and a semiconductor circuit 40. The sensor 50 could be the same as the beam structure shown in FIG. 2A. The semiconductor circuit 40 on the substrate has a first node coupled to the first conducting layer through the first window 36 and a second node coupled to the beam 28 through the second window 38. Therefore, if there is an acceleration force or a temperature variation applied on the sensor 50 and the beam 28 electrically contacts with the walls of the trench 18, the semiconductor circuit 40 could detect and be in response to such electrical contact. FIG. 9B is a schematic cross-section view of the integrated circuit along line 9B-9B in FIG. 9A. The semiconductor circuit 40 comprises at least a MOS circuit 41, as shown in FIG. 9B. The material of an oxide layer 411 in the MOS circuit 41 could be the same as the material of the sacrificial layer 26 in the sensor, and the material of the metal layer 412 in the MOS circuit 41 could be the same as the first conducting layer 281 of the beam 28 in the sensor 50. Therefore, the manufacturing of the sensor 50 is compatible with the existing process to manufacture MOS or CMOS circuits.

Figure 10:
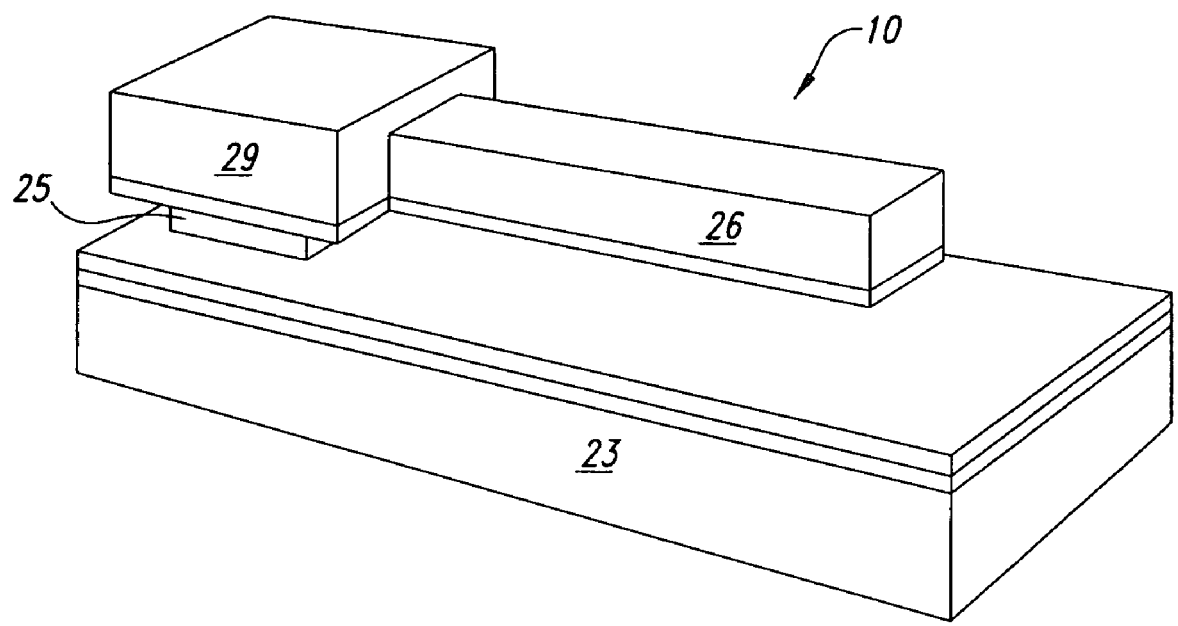
FIG. 10 is an isometric view of a released beam structure according to U.S. Pat. No. 6,218,209.

The fabrication sequence that is used to make the trench released beam structures may also be used to simultaneously make released beam structures that are not in a trench. A device which is similar to the structure of the released beam device of the '209 patent is shown in FIG. 10. The ability to simultaneously manufacture released beam structures that are in a trench and above a planar surface allows the fabrication of a released beam sensor with sensing devices that are in three orthogonal directions. Such as sensor may be used to monitor the acceleration in any direction.

As can be seen in FIG. 10, a released beam assembly 20 includes a substrate 23 and a beam 26. A pedestal 25 supports the structure 29 from which the beam 26 extends. Conductive layers on the underside of beam 26 as well as on the upper surface of substrate 23 contact each other when the beam 26 deflects under acceleration, thus providing an electrical signal which is sensed by other circuitry.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention and can be made without deviating from the spirit and scope of the invention. These and other modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. A semiconductor structure comprising:
   a semiconductor substrate;
   a first trench extending in a first direction, the first trench having walls;
   a second trench extending in a second direction, the second trench having walls;
   a first conducting layer positioned over the walls of the first and the second trenches at selected locations;
   a first beam positioned within the first trench, the first beam being rigidly connected at a first portion thereof to the substrate and being movable at a second portion thereof, the second portion being spaced from the walls of the first trench by a selected distance; and
   a second beam positioned within the second trench, the second beam being rigidly connected at a first portion thereof to the substrate and being movable at a second portion thereof, the second portion being spaced from the walls of the second trench by a selected distance.

2. The semiconductor structure of claim 1 wherein the length of the first beam is different from the length of the second beam.

3. The semiconductor structure of claim 1 wherein the width of the first beam is different from the width of the second beam.

4. The semiconductor structure of claim 1 wherein the width of the first trench is different from the width of the second trench.

5. The semiconductor structure of claim 1 wherein the thickness of the first beam is different from the thickness of the second beam.

6. The semiconductor structure of claim 1 wherein the first direction is parallel to the second direction.

7. The semiconductor structure of claim 1 wherein the first direction is perpendicular to the second direction.

8. The semiconductor structure of claim 1 wherein the first direction and the second direction are in an arrangement so that the first trench and the second trench have a common radius from a common point.

9. The semiconductor structure of claim 8 wherein the first beam is perpendicular to a first line extending from the center of a circle and the second beam is perpendicular to a second line extending from the center of the same circle.

10. The semiconductor structure of claim 8 wherein the first beam is parallel to and on a first line extending from the center of a circle and the second beam is parallel to and on a second line extending from the center of the same circle.

11. The semiconductor structure of claim 1, further comprising a first dielectric layer between the first trench and the first conducting layer, and between the second trench and the first conducting layer.

12. The semiconductor structure of claim 1, further comprising a first remaining sacrificial layer between the first portion of the first beam and the first conducting layer, and between the first portion of the second beam and the first conducting layer.

13. The semiconductor structure of claim 1 further comprising:
   a circuit configured to detect an electrical connection between the first beam and the first conducting layer and between the second beam and the first conducting layer.

14. The semiconductor structure of claim 13 wherein the circuit is formed in the semiconductor substrate.

15. An integrated circuit on a semiconductor substrate comprising:
   a sensor including:
   a trench extending from a first surface into the substrate, the trench having walls,
   a first conducting layer positioned over the walls of the trench at selected locations, and
   a beam positioned within the trench, the beam being connected at a first portion thereof to the substrate and being movable at a second portion thereof, the second portion being spaced from the walls by a selected distance; and
   a semiconductor circuit on the substrate having a first node coupled to the first conducting layer and a second node coupled to the beam, the semiconductor circuit configured to detect electrical contact between the beam and the trench.

16. The integrated circuit of claim 15 wherein the sensor further comprises a first dielectric layer between the trench and the first conducting layer.

17. The integrated circuit of claim 15 wherein the sensor further comprises a remaining sacrificial layer between the first portion of the beam and the first conducting layer.

18. A semiconductor structure comprising:
   a semiconductor substrate;
   a first trench extending in a first direction, the first trench having walls;
   a second trench extending in a second direction, perpendicular to the first direction, the second trench having walls;
   a first conducting layer positioned over the walls of the first and the second trenches at selected locations;
   a first beam positioned within the first trench, the first beam being connected at a first portion thereof to the substrate and being movable at a second portion thereof, the second portion being spaced from the walls of the first trench by a selected distance;
   a second beam positioned within the second trench, the second beam being connected at a first portion thereof to the substrate and being movable at a second portion thereof, the second portion being spaced from the walls of the second trench by a selected distance; and
   a third beam that is parallel to the surface of the semiconductor substrate having its primary axis of motion perpendicular to the surface of the substrate.

19. The semiconductor structure of claim 18 wherein the length of the first beam is the same as the length of the second beam.

20. The semiconductor structure of claim 18 wherein the width of the first beam is the same as the width of the second beam.

21. The semiconductor structure of claim 18 wherein the width of the first trench is the same as the width of the second trench.

22. The semiconductor structure of claim 18 wherein the thickness of the first beam is the same as the thickness of the second beam.

23. The semiconductor structure of claim 18 wherein the length of the first beam is the different from the length of the third beam.

24. The semiconductor structure of claim 18 wherein the width of the first beam is the different from the width of the third beam.

25. The semiconductor structure of claim 18 wherein the thickness of the first beam is the different from the thickness of the third beam.

26. The semiconductor structure of claim 18 wherein the third beam is built in a third trench.

27. The semiconductor structure of claim 26 wherein the width of the first trench is different from the width of the third trench.

28. The semiconductor structure of claim 26 wherein the depth of the first trench is different from the depth of the third trench.

* * * * *

UNITED STATES PATENT AND TRADEMARK OFFICE
CERTIFICATE OF CORRECTION

PATENT NO.         : 7,397,097 B2
APPLICATION NO. : 10/721524
DATED              : July 8, 2008
INVENTOR(S)        : Richard A. Blanchard et al.

It is certified that error appears in the above-identified patent and that said Letters Patent is hereby corrected as shown below:

Column 10
Line 24, "length of the first beam is the different from the length of the" should read as -- length of the first beam is different from the length of the --

Column 10
Line 27, "width of the first beam is the different from the width of the" should read as -- width of the first beam is different from the width of the --

Column 10
Line 30, "thickness of the first beam is the different from the thickness" should read as -- thickness of the first beam is different from the thickness --

Signed and Sealed this

Twenty-fifth Day of November, 2008

JON W. DUDAS
*Director of the United States Patent and Trademark Office*